(12) United States Patent
Tsai et al.

(10) Patent No.: US 11,881,503 B2
(45) Date of Patent: *Jan. 23, 2024

(54) SEMICONDUCTOR MEMORY DEVICE

(71) Applicant: Fujian Jinhua Integrated Circuit Co., Ltd., Quanzhou (CN)

(72) Inventors: Pei-Ting Tsai, Quanzhou (CN);
Yu-Cheng Tung, Quanzhou (CN);
Tsuo-Wen Lu, Quanzhou (CN);
Min-Teng Chen, Quanzhou (CN);
Tsung-Wen Chen, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/078,100

(22) Filed: Dec. 9, 2022

(65) Prior Publication Data

US 2023/0106501 A1    Apr. 6, 2023

Related U.S. Application Data

(63) Continuation of application No. 17/232,160, filed on Apr. 16, 2021, now Pat. No. 11,557,645.

(30) Foreign Application Priority Data

Dec. 25, 2020    (CN) .......................... 202011567541.4

(51) Int. Cl.
*H10B 20/00*    (2023.01)
*H10B 41/20*    (2023.01)
(Continued)

(52) U.S. Cl.
CPC .............. *H01L 28/91* (2013.01); *H01L 28/90* (2013.01); *H10B 20/50* (2023.02); *H10B 41/20* (2023.02);
(Continued)

(58) Field of Classification Search
CPC ........... H01L 29/6684; H01L 29/78391; H01L 27/11551; H01L 28/60; H01L 28/90–91;
(Continued)

(56) References Cited

U.S. PATENT DOCUMENTS 8,970,039 B2    3/2015    Kuh et al.
9,153,639 B2    10/2015    Lee
(Continued)

*Primary Examiner* — Jose R Diaz
(74) *Attorney, Agent, or Firm* — Winston Hsu

(57) ABSTRACT

The present invention provides a semiconductor memory device including a substrate, a plurality of capacitors and a supporting layer disposed on the substrate, wherein each of the capacitors is connected with at least one of the adjacent capacitors through the supporting layer. Each of the capacitors includes first electrodes, a high-k dielectric layer and a second electrode, and the high-k dielectric layer is disposed between the first electrodes and the second electrode. Due to the supporting layer directly contacts the high-k dielectric layer through a surface thereof, and the high-k dielectric layer completely covers the surface, the second electrode may be formed directly within openings with an enlarged dimension. Accordingly, the process difficulty of performing the deposition and etching processes within the openings may be reduced, and the capacitance of the capacitors is further increased.

20 Claims, 7 Drawing Sheets

(51) Int. Cl.
*H10B 41/30* (2023.01)
*H10B 43/20* (2023.01)
*H10B 43/30* (2023.01)
*H10B 51/20* (2023.01)
*H01L 49/02* (2006.01)

(52) U.S. Cl.
CPC ............ *H10B 41/30* (2023.02); *H10B 43/20* (2023.02); *H10B 43/30* (2023.02); *H10B 51/20* (2023.02); *H01L 28/60* (2013.01)

(58) Field of Classification Search
CPC ........ H10B 20/50; H10B 41/20; H10B 43/20; H10B 51/20; H10B 53/20; H10B 12/033; H10B 41/30; H10B 43/30
See application file for complete search history.

(56) References Cited

U.S. PATENT DOCUMENTS

| | | | |
|---|---|---|---|
| 10,283,509 B2 | 5/2019 | Pak et al. | |
| 11,557,645 B2 * | 1/2023 | Tsai | ................. H10B 20/50 |
| 2009/0212338 A1 | 8/2009 | Benson | |
| 2016/0343799 A1 | 11/2016 | Yi | |
| 2020/0152584 A1 | 5/2020 | Sohn | |

* cited by examiner

SEMICONDUCTOR MEMORY DEVICE

CROSS REFERENCE TO RELATED APPLICATIONS

This application is a continuation application of U.S. application Ser. No. 17/232,160, filed on Apr. 16, 2021. The content of the application is incorporated herein by reference.

BACKGROUND OF THE INVENTION

1. Field of the Invention

The present invention generally relates to a semiconductor device, and more particularly to a semiconductor memory device.

2. Description of the Prior Art

A semiconductor memory device with capacitors is one of the necessary components in the integrated circuit, which provides functions of voltage adjustment, filtering, and the like.

Capacitors are usually divided into horizontal capacitors and vertical capacitors. The vertical capacitors having a plurality of deep grooves filled with lower electrode materials in the substrate, so as to reduce the occupied area of the capacitors by providing the plate area of the capacitors through the sidewalls of the deep grooves, and also to obtain a larger capacitance at the same time.

Recently, the current manufacturing process of the vertical capacitors generally includes: filling deep grooves with lower electrode materials to form a plurality of mutually independent lower electrodes, connecting the lower electrodes adjacent to each other through supporting layers, breaking a portion of the supporting layers between the adjacent lower electrodes to form openings between the adjacent lower electrodes, and then sequentially covering the surfaces of the lower electrodes with dielectric layers and upper electrodes to obtain a plurality of capacitors corresponding to the lower electrodes respectively, and each capacitor is connected with at least one capacitor adjacent thereto through the supporting layers.

However, with the continuous reduction of the device size, the size of the opening formed by breaking the supporting layers also gradually decreases, which greatly increases the aspect ratio of the opening. While further filling in the required dielectric layer and the upper electrode in the opening in the subsequent processes, the fabricating difficulties are increased and the capacitance of the capacitor in the semiconductor memory is difficult to further increase accordingly.

SUMMARY OF THE INVENTION

The primary purpose of the present invention is to provide a semiconductor memory device, so as to solve the difficulty of further increasing the capacitance of a capacitor in the semiconductor memory device in prior art.

To achieve the purpose described above, one embodiment of the present invention provides a semiconductor memory device including a substrate, a plurality of first electrodes, a high-k dielectric layer, a first supporting layer, a second high-k dielectric layer, and a second electrode. The first electrodes are disposed on the substrate, and the first high-k dielectric layer is disposed on sidewalls of each of the first electrode. The second high-k dielectric layer is disposed over the substrate, covering the first electrodes and the first high-k dielectric layer. The first supporting layer is disposed over the substrate, between two adjacent ones of the first electrodes, wherein the first high-k dielectric layer directly contacts two opposite surfaces of the first supporting layer, and the second high-k dielectric layer directly contacts two opposite surface of the first supporting layer, and a top portion of the first electrode simultaneously contacts the first high-k dielectric layer and the first supporting layer. The second electrode is disposed on the second high-k dielectric layer, wherein the second high-k dielectric layer is disposed between the first electrode and the second electrode.

To achieve the purpose described above, one embodiment of the present invention provides a semiconductor memory device including a plurality of first electrodes, a first high-k dielectric layer, a supporting layer, a second high-k dielectric layer, and a second electrode. The first electrodes have opposite sidewalls, and the first high-k dielectric layer is disposed on the opposite sidewalls of each of the first electrodes. The supporting layer is disposed between the first high-k dielectric layer disposed on the opposite sidewalls to connect with thereto. The second high-k dielectric layer is disposed on the first electrodes, the first high-k dielectric layer and the first supporting layer. The second electrode is disposed on the second high-k dielectric layer, wherein the first high-k dielectric layer has two opposite sidewalls being respectively contacting the first electrode, and sidewalls of the supporting layer and the second high-k dielectric layer.

To achieve the purpose described above, one embodiment of the present invention provides a semiconductor memory device including a plurality of first electrodes, a first high-k dielectric layer, a supporting layer, a second high-k dielectric layer, and a second electrode. The first electrodes have opposite sidewalls, and the first high-k dielectric layer is disposed on the opposite sidewalls of each of the first electrodes, wherein a portion of the opposite sidewalls of the first electrodes is exposed from the first high-k dielectric layer. The supporting layer is disposed between the first high-k dielectric layer disposed on the opposite sidewalls to connect with thereto. The second high-k dielectric layer is disposed on the first electrodes, the first high-k dielectric layer and the first supporting layer, wherein the second high-k dielectric layer directly contacts the portion of the sidewalls of the first electrodes. The second electrode is disposed on the second high-k dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings of the specification forma part of the present invention, and which are used to provide a further understanding of the present invention. The illustrative embodiments of the present invention and their descriptions are used to explain the present invention, and do not constitute an improper limitation of the present invention. In the drawings.

DETAILED DESCRIPTION

It should be noted that different embodiments or the technical features in different embodiments described in the following may be replaced, recombined, or mixed with one another without departing from the spirit of the present invention. The presented invention is described in detail with reference to the embodiments in the accompanying drawings.

For better understanding of the presented invention, the technical scheme in the embodiments of the present invention will be described clearly and completely with reference to the drawings in the embodiments of the present invention. Obviously, the described embodiments are only a part of the embodiments of the present invention, not all of them. According to the embodiments of the present invention, all other embodiments obtained by ordinary technicians in the arts without creative labor should belong to the protecting scope of the present invention.

It is understood that, although the terms first, second, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. In addition, the terms "including" and "having" and any variations thereof are intended to cover non-exclusive inclusion. For example, a process, method, system, product or equipment include a series of steps or units but not be limited to those steps or units explicitly listed, and which may include other steps or units not explicitly listed or inherent to these processes, methods, products or equipment.

As introduced in the background art, with the continuous reduction of the device size, the size of the opening formed by breaking the supporting layer is gradually reduced, which greatly increases the aspect ratio of the opening. As the dielectric layer and the upper electrode are required to be filled in the opening in the subsequent processes, the fabricating difficulties are increased thereby, thus that the capacitance of the capacitor in the semiconductor memory device is difficult to further increase accordingly.

Figure 1:
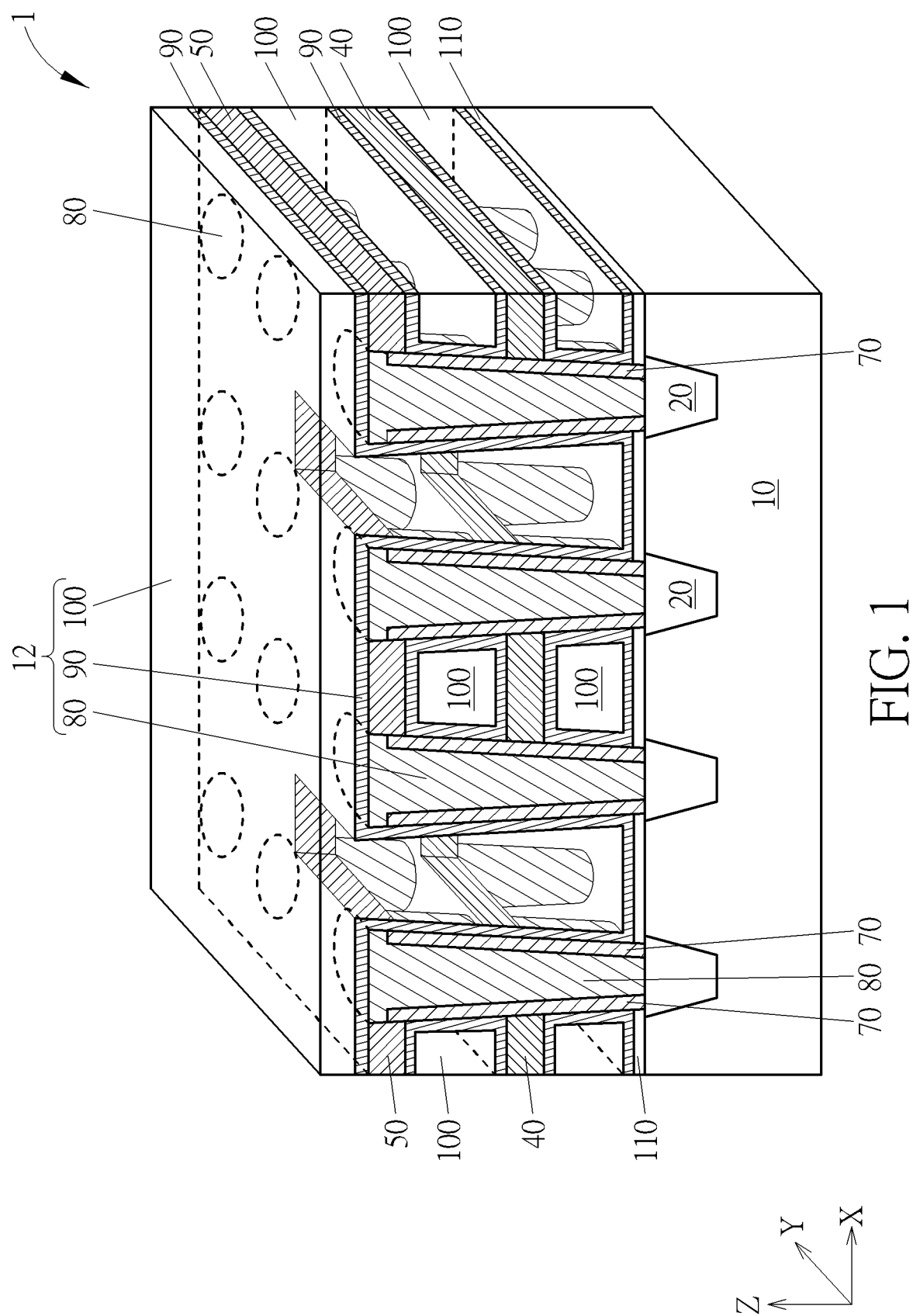
FIG. 1 is a schematic diagram illustrating a three-dimensional view of a semiconductor memory device according to one embodiment of the present invention.
Figure 2:
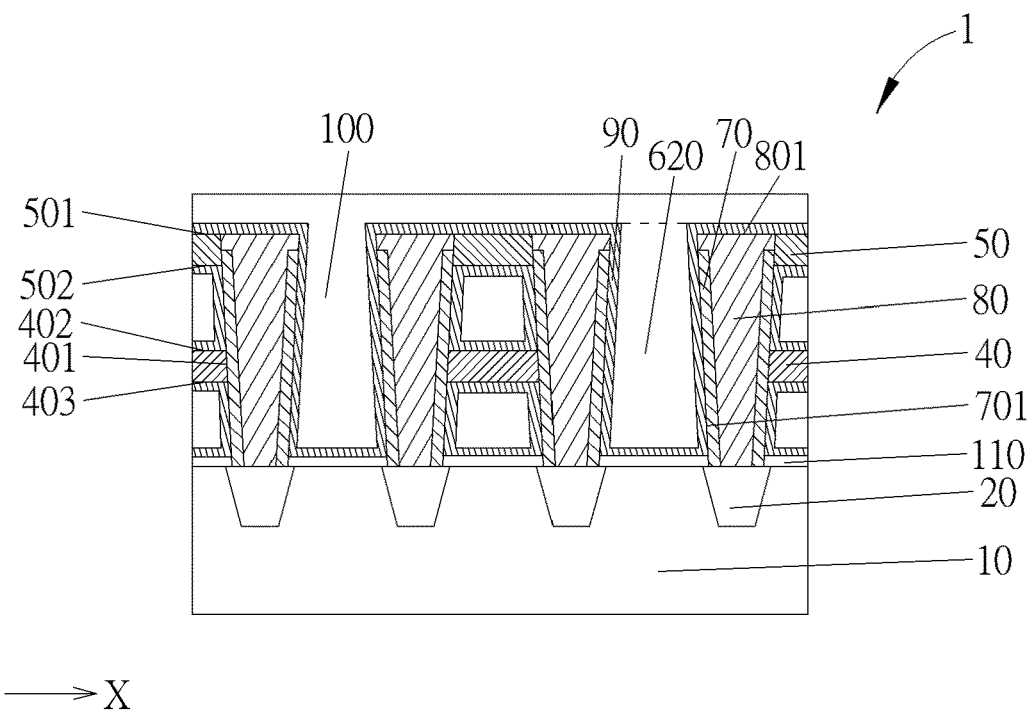
FIG. 2 is a schematic diagram illustrating a cross-sectional view of a semiconductor memory device according to the embodiment of the present invention.

In view of the above problems, a semiconductor memory device 1 according to an embodiment of the present invention is provided as shown in FIGS. 1-2, with FIG. 1 illustrating a three-dimensional (3D) view of the semiconductor memory device 1 and with FIG. 2 illustrating a cross-sectional view of the semiconductor memory device 1. The semiconductor memory device 1 includes a substrate 10 for example including a semiconductor substrate such as a silicon substrate, a silicon-containing substrate, a silicon-on-insulator (SOI) substrate or a germanium-on insulator substrate (GOI), and a plurality of capacitors 12 disposed on the substrate 10, wherein each of the capacitors 12 includes a first electrode (also known as a lower electrode) 80, a high-k dielectric layer 90 and a second electrode (also known as a upper electrode) 100 stacked from bottom to top. In one embodiment, the material of the semiconductor substrate may include single crystal silicon (Si), single crystal germanium (Ge), silicon germanium (GeSi), silicon carbide (Sic), or other suitable materials such as gallium arsenide and other III-V compounds, the material of the high-k dielectric layer 90 for example includes titanium oxide ($TiO_x$) or zirconium oxide ($ZrO_x$), and the material of the first electrode 80 and the second electrode 100 may include titanium nitride (TiN), but is not limited thereto.

It is noted that the substrate 10 further includes at least one shallow trench isolation (STI, not shown in the drawings) disposed within the semiconductor substrate, a plurality of buried gate structures (also known as buried word lines, not shown in the drawings) respectively extending along a direction "X" within the semiconductor substrate, a plurality of conductive lines (not shown in the drawings) extending along a direction "Y" within a dielectric layer (also known as bit lines, not shown in the drawings) disposed over the semiconductor substrate, and a plurality of contact plugs 20 also extending along the direction "Y" within the dielectric layer over the semiconductor substrate, but not limited thereto. For better understanding of the detailed structure of the capacitors 12 in the present embodiment, the aforementioned STI, the buried word lines (BWL), the dielectric layer and the bit lines (BL) are omitted in FIGS. 1-2. However, people in the art should easily realizes the detailed arrangements of the aforementioned STI, the BWL, the dielectric layer and the BL in the semiconductor memory device 1, and also, the semiconductor memory device 1 may further include other active elements which is not shown in the drawings due to practical requirements.

Figure 3:
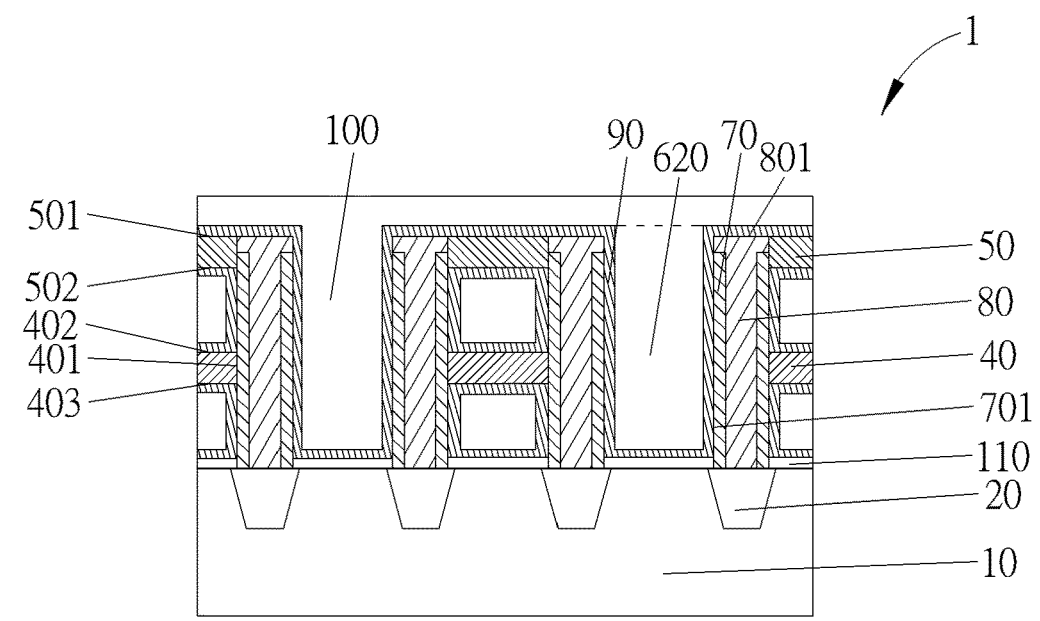
FIG. 3 is a schematic diagram illustrating a cross-sectional view of a semiconductor memory device according to another embodiment of the present invention.

As shown in FIGS. 1-2, the first electrodes 80 are vertically and separately disposed on the substrate 10, with each of the first electrodes 80 extending along a direction "Z" which is perpendicular to the substrate 10, to in alignment with each of the contact plugs 20 within the substrate 10 and to electrically connect with thereto. Please note that, each of the first electrodes 80 for example includes a T-shaped structure in a cross-sectional view as shown in FIG. 2, and a high-k dielectric layer 70 may be disposed on two opposite sidewalls of the vertical portion of the T-shaped structure, with the horizontal portion of the T-shaped structure being exposed from the high-k dielectric layer 70. People in the art should fully understand that the high-k dielectric layer 70 may entirely surrounds the vertical portion of the T-shaped structure while being viewed from a 3D view shown in FIG. 1, but is not limited thereto. In one embodiment, each of the first electrodes 80 may include inclined sidewalls, and sidewalls of the horizontal portion of the T-shaped structure and sidewalls of the high-k dielectric layer 70 are continuously inclined. Then, the first electrodes 80 and the high-k dielectric layer 70 may together form a quadrilateral shape which is wide at the top and narrow at the bottom through a cross-sectional view shown in FIG. 2, but is not limited thereto. In another embodiment, each of the first electrodes 80 may also include vertical sidewalls being vertical to the substrate 10, and the sidewalls of the horizontal portion of the T-shaped structure may be vertically aligned with the sidewalls of the high-k dielectric layer 70. Then, the first electrodes 80 and the high-k dielectric layer 70 may together form a rectangular shape through a cross-sectional view shown in FIG. 3.

The semiconductor memory device 1 further includes an insulating layer 110, a supporting layer 40 and a supporting layer 50 separately disposed over the substrate 10, wherein the insulating layer 110 directly covers top surfaces of the substrate 10 and the contact plugs 20, and the supporting layer 40 and the supporting layer 50 are sequentially and parallelly disposed over the insulating layer 110 from bottom to top. In one embodiment, the material of the supporting layer 40 may include silicon nitride, and the material of the supporting layer 50 may be the same or different from that of the supporting layer 40, but is not limited thereto. As shown in FIGS. 1-2, the supporting layer 40 and the supporting layer 50 are both extended along the direction "X", between two adjacent ones of the first electrodes 80, wherein the supporting layer 40 may directly contact the high-k dielectric layer 70 through a surface 401 thereof, and the supporting layer 50 may directly contact the high-k dielectric layer 70, as well as a portion of the first electrode 80 namely the horizontal portion of the T-shaped structure. Accordingly, the supporting layer 40 and the supporting layer 50 may respectively provide a lateral supporting to the middle portion and the top portion of each first electrode 80, and also, through the high-k dielectric layer 70, the supporting layer 40 and the first electrodes 80 are completely isolated from each other, and the supporting layer 50 and the first electrodes 80 are partially isolated from each other. It is noteworthy that, the supporting layer 40 and the supporting layer 50 are only disposed at one side of each first electrode 80, with another side of the first electrode 80 without contacting to any supporting layer to define a plurality of openings 620 between the first electrode 80, as shown in FIGS. 1-2. In other words, the supporting layer 40 and the supporting layer 50, and the openings 620 are respectively disposed at two opposite side of each of the first electrodes 80, through a cross-sectional view taken along the direction "X" as shown in FIG. 2.

Further in view of FIGS. 1-2, the high-k dielectric layer 90 is conformally disposed on the first electrodes 80 and the inner surface of the openings 620, to cover a top surface 801 of the first electrodes 80, and at least partial surfaces 701 of the high-k dielectric layer 70 and top surfaces of the insulating layer 110 exposed from the openings 620. The high-k dielectric layer 90 directly contacts to a portion of the first electrode 80 namely the horizontal portion of the T-shaped structure and the high-k dielectric layer 70. Furthermore, the high-k dielectric layer 90 directly contacts the top surfaces of the insulating layer 110, and both of two opposite surfaces 402, 403 of the supporting layer 40 in the direction "Z", as well as both of two opposite surfaces 501, 502 of the supporting layer 50 in the direction "Z". Accordingly, the high-k dielectric layer 90 may simultaneously contact the high-k dielectric layer 70 disposed on the two opposite sides of the vertical portion of the T-shaped structure. In one embodiment, the material of the high-k dielectric layer 90 may be different from that of the high-k dielectric layer 70, but is not limited thereto.

Then, the second electrode 100 is disposed on the high-k dielectric layer 90, to fill up the rest portions of the openings 620, the rest spaces between the insulating layer 110 and the first supporting layer 40, and the rest spaces between the supporting layer 40 and the supporting layer 50, so that the high-k dielectric layer 90 may be therefore disposed between the first electrodes 80 and the second electrode 100 for isolating. In this way, a portion of the second electrode 100 may be disposed between the supporting layer 50 and the supporting layer 40, and between the supporting layer 40 and the insulating layer 110, with the portion of the second electrode 100 being surrounded by the high-k dielectric layer 90, and another portion of the second electrode 100 may be filled in the openings 620, between any two of the first electrodes 80, with the another portion of the second electrode 100 being isolated from the substrate 10 through the insulating layer 110.

Through these arrangements, the supporting layers 40, 50 may provide a proper lateral supporting to the capacitors 12 of the semiconductor memory device 1 according to the present embodiment of the present invention, and thus that, each of the capacitors 12 may be connected with at least one of the adjacent capacitors 12 through the supporting layers 40, 50, as shown in FIGS. 1-2. In addition, due to the first supporting layer 40 of the semiconductor memory device 1 directly contacting the high-k dielectric layer 70 through the surface 401, and the high-k dielectric layer 70 completely covering the surface 401, the high-k dielectric layer 70 may be formed before the formation of the first electrode 80, the second electrode 100 may be formed directly after the openings 620 are defined by removing the supporting layers 40, 50 between at least a pair of the first electrodes 80, and the high-k dielectric layer 70 may be disposed outside the openings 620, so as to enlarge the dimension of the openings 620. Accordingly, the process difficulty of performing the deposition and etching processes within the openings 620 may be reduced, which is beneficial to further increase the capacitance of the capacitors 12.

In order to enable one of ordinary skill in the art to implement the present invention, a fabricating method of the semiconductor memory device 1 of the present invention is further described below. As shown in FIGS. 4-10, the fabricating method of the semiconductor memory device includes following steps. Firstly, a substrate 10 is provided, the substrate 10 at least includes a semiconductor substrate such as a silicon substrate, a silicon-containing substrate, a silicon-on-insulator (SOI) substrate or a germanium-on insulator substrate (GOI), and the material of the semiconductor substrate may include single crystal silicon, single crystal germanium, silicon germanium, silicon carbide or other suitable materials such as gallium arsenide and other III-V compounds, but not limited thereto. Furthermore, the substrate 10 may include at least one STI and the BWLs both formed within the semiconductor substrate, as well as the BLs and contact plugs 20 both formed within a dielectric layer formed over the semiconductor substrate, but not limited thereto. For better understanding of the detailed formations of the capacitors 12 of the semiconductor memory device 1 in the present embodiment, the aforementioned STI, the BWLs, the dielectric layer and the BL are all omitted in FIGS. 4-10.

Figure 4:
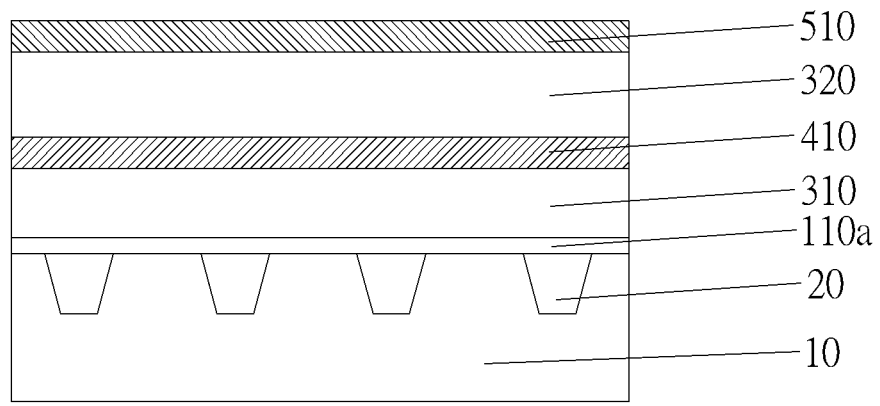
FIG. 4 is a schematic diagram illustrating a cross-sectional view of a semiconductor structure after forming a stacked structure on a substrate in a fabricating method of a semiconductor memory device according to an embodiment of the present invention.

As shown in FIG. 4, a stacked structure is formed on the substrate 10, and the stacked structure for example includes an insulating layer 110*a*, a sacrificial layer 310, a supporting material layer 410, a sacrificial layer 320, and a supporting material layer 510 stacked from bottom to top, wherein the insulating layer 110*a* directly covers the top surfaces of the substrate 10 and the contact plugs 20 for isolating the substrate 10 from layers disposed thereon. In the present embodiment, each of the sacrificial layer 310, the supporting material layer 410, the sacrificial layer 320, and the supporting material layer 510 may but not limited to be formed through a deposition process such as an atmospheric pressure chemical vapor deposition (APCVD) process or a low pressure chemical vapor deposition (LPCVD) process. In one embodiment, the material of the supporting material layer 410 may include silicon nitride, the material of the supporting material layer 510 may be the same or different from that of the supporting material layer 410, and the material of the sacrificial layers 310, 320 may include boron phosphorus oxide, but not limited thereto. Also, people in the art should fully understand that the practical arranged number or the practical arranged order of the supporting material layers and the sacrificial layers within the stacked structure may all be adjustable based on product requirements, for example, in other embodiments, the insulating layer 110*a* and/or the supporting material layer 510 may also be omitted.

Figure 5:
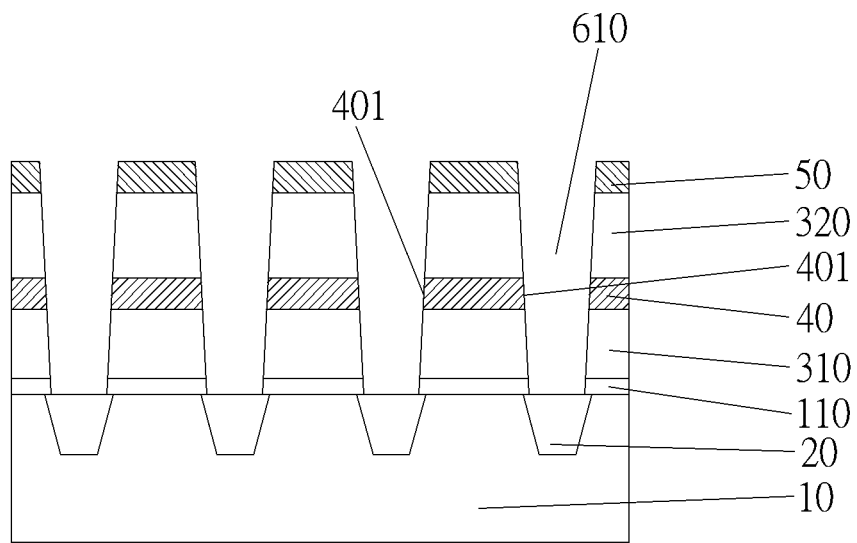
FIG. 5 is a schematic diagram illustrating a cross-sectional view of a semiconductor structure after forming openings penetrating the stacked structure.

Next, as shown in FIG. 5, a plurality of openings 610 is formed to penetrate through the stacked structure, thereby partially exposing the top surfaces of the contact plugs 20. In one embodiment, the formation of the openings 610 may be accomplished by sequentially forming a mask layer (not shown in the drawings) such as including polysilicon, and a photoresist layer (not shown in the drawings) on the stacked structure, performing a photolithography process and an etching process such as a plasma dry etching process through the photoresist layer, to pattern the mask layer, as well as the stacked structure underneath. Accordingly, the openings 610 are formed within the stacked structure, and also, the aforementioned insulating layer 110, the supporting layers 40, 50 as shown in FIGS. 1-2 are formed, with the surfaces 401 of the supporting layers 40 being exposed from the openings 610. Then, the photoresist layer and the mask layer are completely removed.

Figure 6:
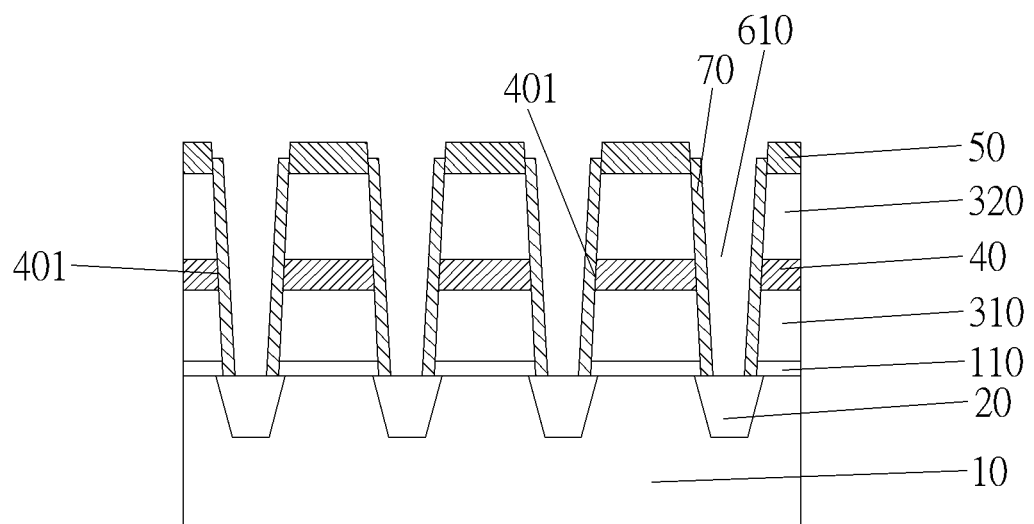
FIG. 6 is a schematic diagram illustrating a cross-sectional view of a semiconductor structure after forming a high-k dielectric layer.
Figure 7:
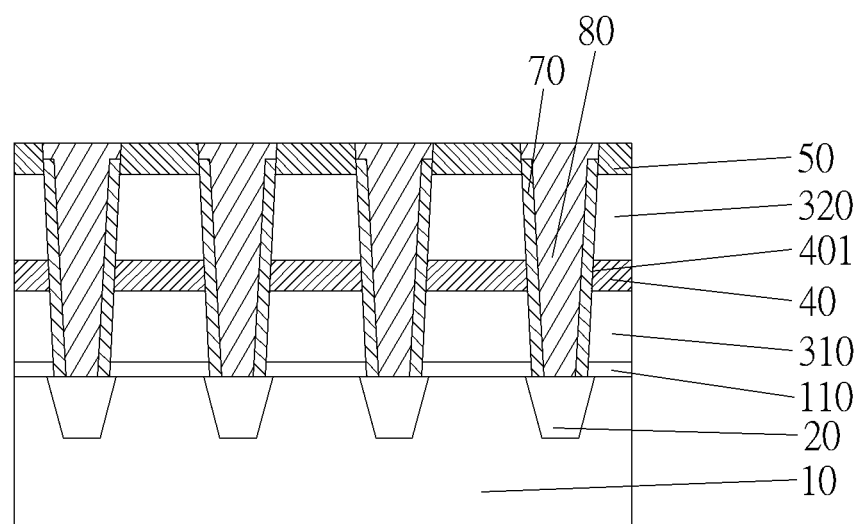
FIG. 7 is a schematic diagram illustrating a cross-sectional view of a semiconductor structure after forming first electrodes

As shown in FIGS. 6-7, the high-k dielectric layer 70 and the first electrodes 80 are sequentially formed in the openings 610. As shown in FIG. 6, the high-k dielectric layer 70 is firstly formed on sidewalls of the openings 610, with the high-k dielectric layer 70 directly contacts the bottom portion of the sidewalls of the supporting layer 50, the sidewalls of the sacrificial layer 320, the surfaces 401 of the supporting layer 40, the sidewalls of the sacrificial layer 310, and the sidewalls of the insulating layer 110, and with the top surfaces of the contact plugs 20 and the top portion of the sidewalls of the supporting layer 50 being partially exposed from the high-k dielectric layer 70. In one embodiment, the formation of the high-k dielectric layer 70 may be accomplished by firstly performing a deposition process such as an atmospheric pressure chemical vapor deposition (APCVD) or a low pressure chemical vapor deposition (LPCVD), to conformally form a dielectric material layer (not shown in the drawings) for example including titanium oxide or zirconium oxide on all exposed surfaces (including the sidewalls and bottom walls) of the openings 610 and top surfaces of the supporting layer 50, and performing an etching back process to completely remove the dielectric material layer covered on the top surfaces of the supporting layer 50, to partially remove the dielectric material layer covered on the sidewalls and the bottom walls of the openings 610 (also known the dielectric material layer covered on the sidewalls of the supporting layer 50 and the top surfaces of the contact plugs 20), thereby forming the high-k dielectric layer 70. In other words, the topmost end of the high-k dielectric layer 70 is lower than the top surface of the supporting layer 50, as shown in FIG. 6.

As shown in FIG. 7, the first electrodes 80 are respectively formed in each opening 610 to fill up rest portion of the openings 610, so that, the first electrodes 80 may directly contact the top portion of the sidewalls of the supporting layer 150, the high-k dielectric layer 70, and the top surfaces of the contact plugs 20. Then, the high-k dielectric layer 70 may be disposed on sidewalls of the first electrodes 80, between each of the first electrodes 80 and the supporting layers 40, 50, for isolating thereto. In one embodiment, the first electrodes 80 may be titanium nitride or other suitable materials, and which may be formed through an APCVD process or a LPCVD process, but is not limited thereto. Accordingly, each of the first electrodes 80 may be separately and vertically disposed on the substrate 10, in alignment with each of the contact plugs 20 for electrically connecting the contact plugs.

Figure 8:
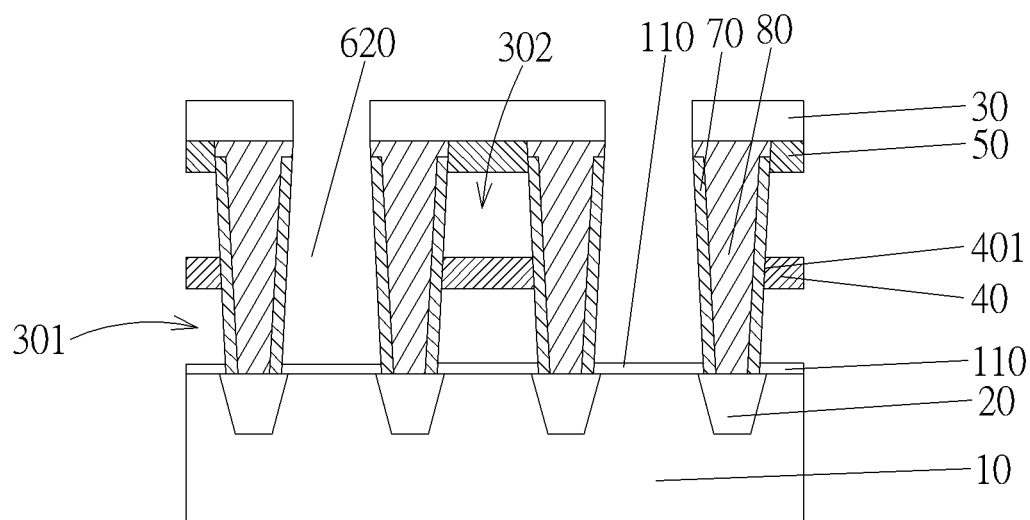
FIG. 8 is a schematic diagram illustrating a cross-sectional structure after removing a sacrificial layer.

Subsequently, the supporting layers 50, 40 between at least two adjacent ones of the first electrodes 80, and the sacrificial layers 320, 310 are completely removed as shown in FIG. 8. Precisely speaking, a mask layer 30 is firstly formed on the stacked structure and the first electrodes 80 to cover a portion of the stacked structure and to partially expose the supporting layer 50, and an etching process is performed through the mask layer 30 to sequentially remove each film of the stacked structure through the exposed supporting layer 50, thereby forming the openings 620. It is noted that, the openings 620 is formed between the high-k dielectric layer 70 disposed on two adjacent ones of the first electrodes 80, and a portion of the insulating layer 110 is exposed at the bottom of each opening 620, as shown in FIG. 8. Furthermore, another etching process such as a wet etching process is then performed to further remove the sacrificial layers 320, 310 of the stacked structure 130 through the openings 620. Accordingly, only the supporting layers 40, 50 at one side of each first electrode 80, as well as the insulating layer 110 are retained, for connecting and lateral supporting the first electrodes 80 through an indirectly manner (because of the high-k dielectric layer 70 being disposed between the first electrodes 80 and the supporting layers 40, 50), and each of the first electrodes 80 may therefore be in connection with at least one of the adjacent first electrodes 80, as shown in FIG. 8. On the other hand, the supporting layer 50, the supporting layer 40 and the insulating layer 110 are respectively spaced from each other, with a space 301, 302 being formed between the supporting layer 50 and the supporting layer 40, and between the supporting layer 40 and the insulating layer 110, as shown in FIG. 8.

Figure 9:
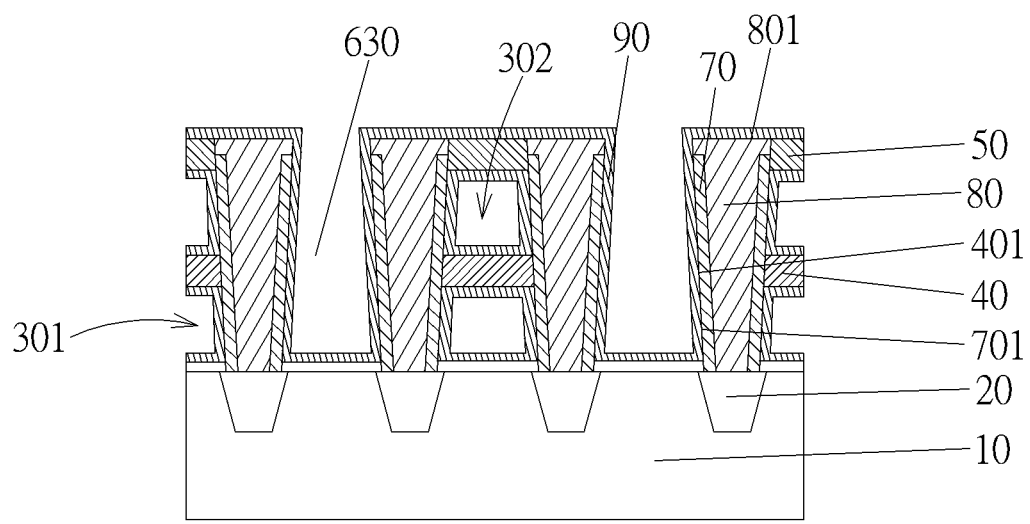
FIG. 9 is a schematic diagram illustrating a cross-sectional view of a semiconductor structure after forming another high-k dielectric layer.
Figure 10:
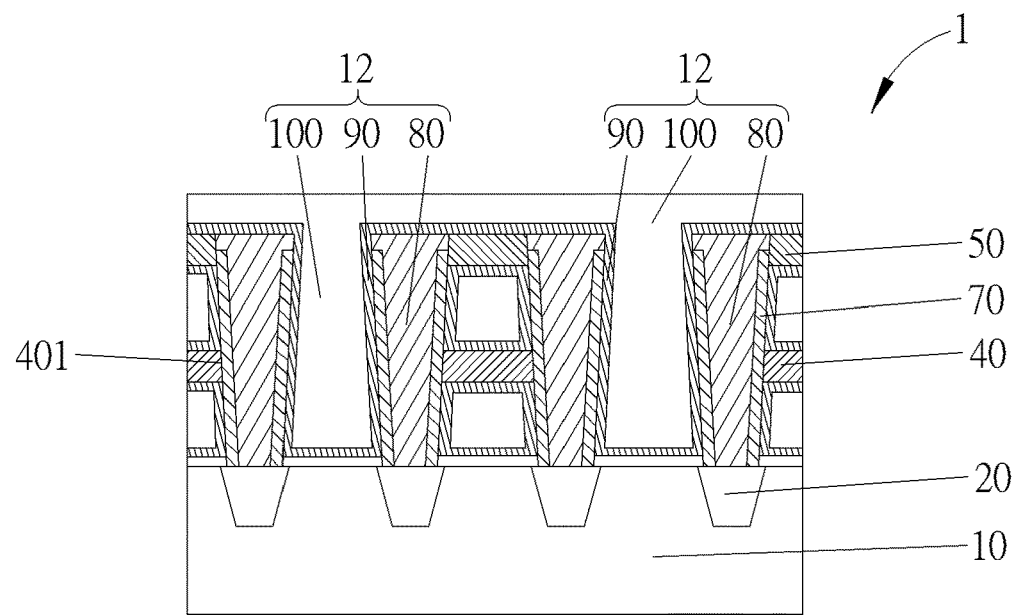
FIG. 10 is a schematic diagram illustrating a cross-sectional view of a semiconductor structure after forming a second electrode.

As shown in FIGS. 9-10, after removing the mask layer 30, the high-k dielectric layer 90 and the second electrode 100 are sequentially formed over the substrate 10. Precisely speaking, the high-k dielectric layer 90 is conformally formed on the supporting layer 50, the first electrodes 80 and surfaces of the openings 620 for example through an APCVD process or a LPCVD process, so as to define a plurality of openings 630, as shown in FIG. 9. Furthermore, the high-k dielectric layer 90 is also formed on surfaces of the spaces 301, 302, with the two opposite surfaces 402, 403 of the supporting layer 40, as well as both of two opposite surfaces 501, 502 of the supporting layer 50 in the direction "Z" being covered by the high-k dielectric layer 90, as shown in FIG. 9. In one embodiment, the high-k dielectric layer 90 for example includes titanium oxide or a zirconium oxide, and the material of the high-k dielectric layer 90 may be the same or different from that of the high-k dielectric layer 70, but is not limited thereto.

Then, as shown in FIG. 10, the second electrode 100 is formed on the high-k dielectric layer 90, filled up the openings 630, the rest portion of the spaces 301, 302, and further disposed over the top surfaces of the supporting layer 50 and the first electrodes 80. In this way, a portion of the second electrode 100 may be disposed between the supporting layer 50 and the supporting layer 40, and between the supporting layer 40 and the insulating layer 110, with the portion of the second electrode 100 being surrounded by the high-k dielectric layer 90, and another portion of the second electrode 100 may be filled in the openings 630, between any two of the first electrodes 80, with the another portion of the second electrode 100 being isolated from the substrate 10 through the insulating layer 110.

Through these performances, the first electrodes 80, the high-k dielectric layer 90 and the second electrode 100 may together form the capacitors 12, and the semiconductor memory device 1 according to the present embodiment of the present invention is obtained thereby. Referring to the semiconductor memory device 1 of the present embodiment, the supporting layers 40, 50 may provide a proper lateral supporting to the capacitors 12, so that, each of the capacitors 12 may be connected with at least one of the adjacent capacitors 12 through the supporting layers 40, 50. In addition, due to the first supporting layer 40 of the semiconductor memory device 1 directly contacting the high-k dielectric layer 70 through the surface 401, and the high-k dielectric layer 70 completely covering the surface 401, the high-k dielectric layer 70 may be formed before the formation of the first electrode 80, the second electrode 100 may be formed directly after the openings 620 are defined by removing the supporting layers 40, 50 between at least a pair of the first electrodes 80, and the high-k dielectric layer 70 may be disposed outside the openings 620, so as to enlarge the dimension of the openings 620. Accordingly, the process difficulty of performing the deposition and etching processes within the openings 620 may be reduced, which is beneficial to further increase the capacitance of the capacitors 12.

People well known in the arts should easily realize the semiconductor memory device and the fabricating method thereof in the present invention is not limited to the aforementioned embodiment, and may further include other examples or variety. The following description will detail the different embodiments of the semiconductor memory device and the fabricating method thereof in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 11:
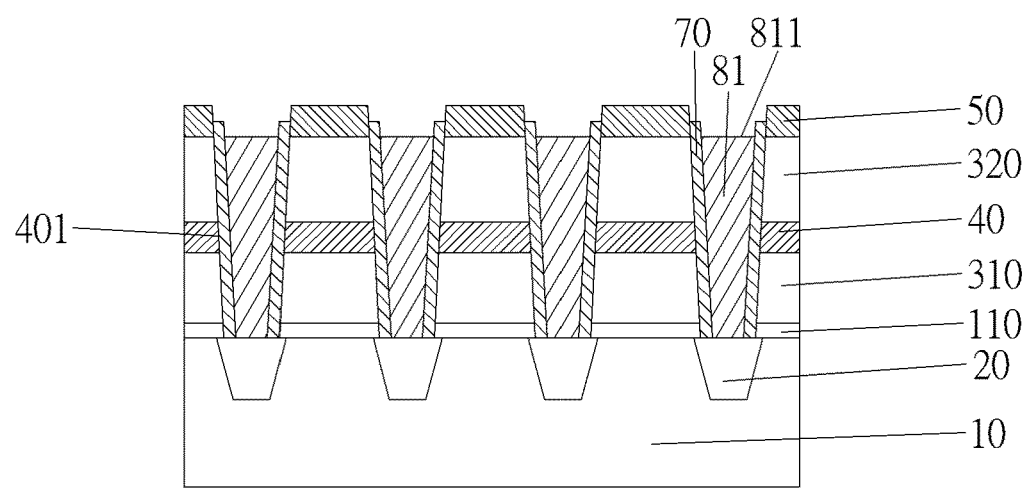
FIG. 11 is a schematic diagram illustrating a cross-sectional view of a semiconductor structure after forming first electrodes in a fabricating method of a semiconductor memory device according to another embodiment of the present invention.
Figure 12:
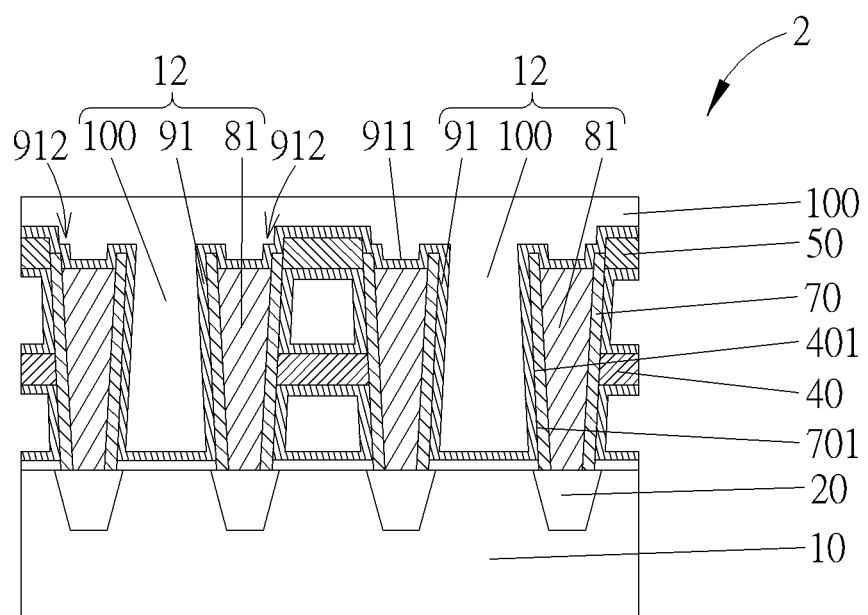
FIG. 12 is a schematic diagram illustrating a cross-sectional view of a semiconductor structure after forming a top electrode.

As shown in FIGS. 11-12, FIGS. 11-12 illustrate schematic diagrams of a fabricating method of a semiconductor memory device 2 according to another embodiment in the present invention. The formal steps of the fabricating method of the semiconductor memory device 1 may be substantially the same as those of the aforementioned embodiment shown in FIGS. 4-10, and the similarities will not be redundantly described thereinafter. The differences between the present embodiment and the aforementioned embodiment is mainly in that a plurality of first electrodes 81 may be formed to obtain a relative lower topmost surface 811 in comparison with the topmost end of the high-k dielectric layer 70

Precisely speaking, as shown in FIG. 11, after forming the semiconductor structure as shown in FIG. 6, the first electrodes 81 may be formed in the openings 610 respectively without filling up each of the openings 610. Accordingly, each of the first electrodes 81 may include a topmost surface 811 which is relative lower than the topmost end of the high-k dielectric layer 70, as shown in FIG. 11. In one embodiment, the topmost surfaces 811 of the first electrodes 81 may be coplanar with top surfaces of the sacrificial layer 320 as shown in FIG. 11, but is not limited thereto. In another embodiment, the topmost surfaces of the first electrodes may also be lower or higher than the top surfaces of the sacrificial layer 320 according to practical product requirements.

After that, as shown in FIG. 12, a high-k dielectric layer 91 and the second electrode 100 are formed over the substrate 10. The high-k dielectric layer 91 is conformally formed on the supporting layer 50, the high-k dielectric layer 70, the first electrodes 81 and surfaces of the openings 620, to directly in contact with thereto. It is noted that, since the topmost end of the high-k dielectric layer 70 is higher than the topmost surface 811 of the first electrodes 81, the high-k dielectric layer 91 conformally formed thereon may therefore obtain a relative lower top surface 911 over the topmost surface 811 of the first electrodes 81, and a stepped structure 912 over the topmost end of the high-k dielectric layer 70, as shown in FIG. 12. Then, the second electrode 100 is formed on the high-k dielectric layer 91.

Through these performances, the first electrodes 81, the high-k dielectric layer 91 and the second electrode 100 also together form the capacitors 12, and the semiconductor memory device 2 according to the present embodiment of the present invention is obtained thereby. Referring to the semiconductor memory device 2 of the present embodiment, the supporting layers 40, 50 may provide a proper lateral supporting to the capacitors 12, so that, each of the capacitors 12 may be connected with at least one of the adjacent capacitors 12 through the supporting layers 40, 50. In this way, the second electrode 100 of the present embodiment may also be formed directly after the openings 620 are defined, so as to obtain an enlarge dimension within the openings 620. Then, the process difficulty of performing the deposition and etching processes within the openings 620 may also be improved, which is beneficial to further increase the capacitance of the capacitors 12.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device comprising:
   a substrate;
   a plurality of first electrodes, disposed on the substrate;
   a first high-k dielectric layer disposed on sidewalls of each of the first electrodes;

a second high-k dielectric layer disposed over the substrate, covering the first electrodes and the first high-k dielectric layer;

a first supporting layer disposed over the substrate, between two adjacent ones of the first electrodes, wherein the first high-k dielectric layer directly contacts two opposite surfaces of the first supporting layer, and the second high-k dielectric layer directly contacts another two opposite surface of the first supporting layer, and a top portion of the first electrode simultaneously contacts the first high-k dielectric layer and the first supporting layer; and a second electrode, disposed on the second high-k dielectric layer, wherein the second high-k dielectric layer is disposed between the first electrodes and the second electrode.

2. The semiconductor memory device according to claim 1, wherein sidewall of the top portion of the first electrodes is exposed from the first high-k dielectric layer and the second high-k dielectric layer directly contacts the sidewall of the top portion of the first electrodes.

3. The semiconductor memory device according to claim 1, wherein each of the first electrodes comprises a T-shaped structure.

4. The semiconductor memory device according to claim 1, further comprising:
a second supporting layer disposed under the first supporting layer, wherein the second supporting layer and the first supporting layer are parallel disposed with each other.

5. The semiconductor memory device according to claim 4, wherein a first portion of the second electrode is disposed between the second supporting layer and the first supporting layer, and second portion of the second electrode is disposed between two adjacent ones of the first electrodes.

6. The semiconductor memory according to claim 1, wherein a topmost surface of the first electrodes is higher than a topmost end of the first high-k dielectric layer.

7. The semiconductor memory according to claim 1, wherein the first electrodes cover a topmost end of the first high-k dielectric layer.

8. The semiconductor memory according to claim 1, wherein bottommost surface of the first electrode and the first high-k dielectric are coplanar.

9. The semiconductor memory according to claim 1, wherein a topmost surface of the first electrodes is lower than a topmost end of the first high-k dielectric layer.

10. A semiconductor memory device comprising
a plurality of first electrodes, having opposite sidewalls;
a first high-k dielectric layer, disposed on the opposite sidewalls of each of the first electrodes;
a supporting layer, disposed between the first high-k dielectric layer disposed on the opposite sidewalls to connect with thereto;
a second high-k dielectric layer, disposed on the first electrodes, the first high-k dielectric layer and the first supporting layer; and
a second electrode, disposed on the second high-k dielectric layer;

wherein the first high-k dielectric layer has two opposite sidewalls being respectively contacting the first electrodes, and sidewalls of the supporting layer and the second high-k dielectric layer.

11. The semiconductor memory according to claim 10, wherein the second high-k dielectric layer directly contacts a top surface and a bottom surface of the first supporting layer.

12. The semiconductor memory according to claim 10, wherein a portion of the opposite sidewalls of the first electrodes is exposed from the first high-k dielectric layer, and the second high-k dielectric layer directly contacts the portion of the sidewalls of the first electrodes.

13. The semiconductor memory according to claim 10, wherein each of the first electrodes comprises a T-shaped structure.

14. A semiconductor memory device comprising:
a plurality of first electrodes, having opposite sidewall;
a first high-k dielectric layer, disposed on the opposite sidewalls of each of the first electrodes, wherein a portion of the opposite sidewalls of the first electrodes is exposed from the first high-k dielectric layer;
a supporting layer, disposed between the first high-k dielectric layer disposed on the opposite sidewalls to connect with thereto;
a second high-k dielectric layer, disposed on the first electrodes, the first high-k dielectric layer and the first supporting layer, wherein the second high-k dielectric layer directly contacts the portion of the sidewalls of the first electrodes; and
a second electrode, disposed on the second high-k dielectric layer.

15. The semiconductor memory device according to claim 14, wherein each of the first electrodes comprises a T-shaped structure.

16. The semiconductor memory device according to claim 14, further comprising:
a second supporting layer disposed over the first supporting layer, wherein the second supporting layer and the first supporting layer are parallel disposed with each other.

17. The semiconductor memory device according to claim 16, wherein a first portion of the second electrode is disposed between the second supporting layer and the first supporting layer, and second portion of the second electrode is disposed between two adjacent ones of the first electrodes.

18. The semiconductor memory according to claim 14, wherein a topmost surface of the first electrodes is higher than a topmost end of the first high-k dielectric layer, and the first electrodes cover the topmost end of the first high-k dielectric layer.

19. The semiconductor memory according to claim 14, wherein bottommost surface of the first electrode and the first high-k dielectric are coplanar.

20. The semiconductor memory according to claim 14, wherein a topmost surface of the first electrodes is lower than a topmost end of the first high-k dielectric layer.

\* \* \* \* \*